United States Patent [19]

Ashiwake et al.

[11] Patent Number: 5,365,400
[45] Date of Patent: Nov. 15, 1994

[54] HEAT SINKS AND SEMICONDUCTOR COOLING DEVICE USING THE HEAT SINKS

[75] Inventors: Noriyuki Ashiwake, Tsuchiura; Takahiro Daikoku, Ushiku; Toshio Hatsuda, Ibaraki; Shizuo Zushi, Hadano, all of Japan; Satomi Kobayashi, Rye, N.Y.

[73] Assignee: Hitachi, Ltd., Japan

[21] Appl. No.: 771,777

[22] Filed: Oct. 4, 1991

Related U.S. Application Data

[63] Continuation-in-part of Ser. No. 535,527, Jun. 11, 1990, abandoned.

[30] Foreign Application Priority Data

Sep. 9, 1988 [JP] Japan .................. 63-224655
Jun. 9, 1989 [JP] Japan .................. 1-145360
Oct. 5, 1990 [JP] Japan .................. 2-266225

[51] Int. Cl.⁵ .................................. H05K 7/20
[52] U.S. Cl. .................. 361/752; 165/80.3; 257/714
[58] Field of Search ............ 165/80.3, 185; 174/16.3; 361/382, 385–386, 388; 357/82

[56] References Cited

U.S. PATENT DOCUMENTS

4,682,651 7/1987 Gabazda ..................... 165/80.3
4,686,606 8/1987 Yamada et al. .............. 361/385

FOREIGN PATENT DOCUMENTS

60-134451 7/1985 Japan .
62-119947 6/1987 Japan .

Primary Examiner—Gregory D. Thompson
Attorney, Agent, or Firm—Evenson, McKeown, Edwards & Lenahan

[57] ABSTRACT

Disclosed are heat sinks particularly effective in cooling semiconductors of a high heat dissipating density and including a multiplicity of tabular fins laminated via spacers and having through-holes pierced in their central parts, the holes admitting introduction of cooling fluids which radially flow in between the fins. The cooling fluids are supplied to the respective heat sinks attached to the multiplicity of semiconductors mounted on a board. In a specific form of the invention, the semiconductor cooling device has a heat sink provided with parallel tabular internal fins and a cooling fluid nozzle having an elongated opening substantially orthogonal to the fins, the nozzle being disposed to span over the parallel tabular fins substantially at longitudinal mid portions of these fins, so that the cooling fluid is evenly distributed from the mid portions of the fins to both longitudinal ends of the fins.

6 Claims, 16 Drawing Sheets

Görtrer's vortex

HEAT SINKS AND SEMICONDUCTOR COOLING DEVICE USING THE HEAT SINKS

CROSS REFERENCE TO RELATED APPLICATION

This is a continuation-in-part of patent application Ser. No. 07/535527 filed on Jun. 11, 1990, now abandoned.

BACKGROUND OF THE INVENTION

The present invention is directed generally to cooling of an appliance, and more particularly, to heat sinks and a semiconductor cooling device using the heat sinks suitable for cooling semiconductor chips having a high heat dissipating density or semiconductor packages.

Disclosed in, e.g., Japanese Patent Unexamined Publication No. 60-134451 is a method of flowing cooling fluids to heat sinks attached to a multiplicity of integrated circuit chips mounted on a multi-layered printed board. An arrangement of this conventional technique is that the heat sinks are composed of tabular fins vertically attached to surfaces of the integrated circuit chips in parallel to a direction in which the integrated circuits are arrayed, the cooling fluids also flow in parallel to the fins in the array direction of the integrated circuit chips. Based on a structure disclosed in U.S. Pat. No. 4,686,606, the heat sinks consisting of the tabular fins perpendicular to the chip surfaces are mounted on the integrated circuit chips, and two bellows tubes each assuming an elliptical configuration in section to cause the cooling fluids to flow in and out of the heat sinks.

In any conventional techniques described above, the cooling fluids run in parallel to the surfaces of the integrated circuit chips. In contrast, according to a structure disclosed in U.S. Pat. No. 4,682,651, the tabular fins are radially mounted on heat dissipating elements, and the cooling fluids are made to flow in a radial direction from the central parts thereof.

Japanese Patent Unexamined Publication No. 62-119947 discloses a structure for cooling integrated circuit elements by means of a heat sink which is provided inside a bellows-type flexible structure and which has a plurality of concentric circular projections provided on a heat transfer surface and a nozzle which blows a refrigerant onto the center of the heat transfer surface.

There arise, however, the following problems inherent in the prior arts. In the technique disclosed in Japanese Patent Unexamined Publication No. 60-134451, the cooling fluids flow in such a direction that a multiplicity of integrated circuit chips are arranged on the board, and hence a temperature of the cooling fluid gradually rises. As a result, the chips disposed backwards encounter deterioration in cooling efficiency. This problem becomes serious, if a heat dissipating density further increases with a higher integration of the integrated circuits.

Steering clear of this problem entails such an arrangement that the integrated circuit chips are, as disclosed in U.S. Pat. No. 4,686,606, mounted with the heat sinks each provided with a bellows for permitting an inflow and outflow of the cooling fluid. According to this prior art, the fins which are provided inside the heat sink and which is vertically attached to the integrated circuit chip surfaces assume parallel tabular configurations, with the result that the flows of the fluid are made uniform. For this reason, there are employed flat bellows each taking an elliptical shape in section. This structure is superior in the cooling effect but suffers the following problem in regard to strength and reliability. A problem peculiar to the elliptical bellows lies in such a point that the bellows is easy to deform in a direction of a minor axis but hard to deform in a direction of a major axis. This property makes it difficult to absorb the thermal deformation in the major axis direction and brings about a possibility that excessive stress acts on the integrated circuit chips. This problem is derived from the fact that the fins assume the parallel tabular configurations, and the cooling fluids are made to flow from one ends of the heat sinks to the other ends thereof in parallel to the surfaces of the integrated circuit chips.

While on the other hand, according to U.S. Pat. No. 4,682,651, although a heat transmissibility from the fins to the cooling fluids typically becomes larger as gaps between the parallel tabular fins become narrower, it is impossible to keep the minute gaps because of the gaps opening in the radial directions in the radially arranged fins, resulting in a drop in the heat transmissibility. This conventional technique adopts the arrangement that the fins stand directly on the surfaces of the heat dissipating elements, and hence the mounting areas thereof are conditioned by the heat dissipating elements. Those fins are restricted in terms of enlargement of the heat transfer area. Besides, if the fins are thinned to enlarge the transfer areas, the fin efficiency decreases. It is eventually difficult to increase a radiating performance well over a certain degree.

The art shown in Japanese Patent Unexamined Publication No. 62-119947 mentioned before employs a bellows having a circular cross-section which allows an easy deflection in all directions. This art, therefore, is free from the problem concerning the strength and reliability encountered with the known art which employs elliptical bellows. The heat transfer mechanism provided on the bottom of the bellows basically relies upon heat transfer provided by impinging jet flow and incorporates concentric annular projections which produce turbulency thereby contributing to promotion of the heat transfer.

The heat transfer promotion effect produced by the annular projections, however, is appreciable only when the height of the projection is not so high, more specifically only when the height to width ratio is near 1.0. Namely, an unduly large height of the projection impedes the flow of the cooling medium thereby suppressing the heat transfer. The art disclosed in Japanese Patent Unexamined Publication No. 62-119947, therefore, is restricted in terms of increase in the heat transfer area and, hence, can provide only limited cooling performance.

SUMMARY OF THE INVENTION

It is a primary object of the present invention to obtain heat sinks capable of obtaining larger heat transfer areas and exhibiting higher heat transfer performance.

It is another object of the present invention to obtain heat sinks capable of uniformly cooling bodies to be cooled by flowing cooling fluids in radial directions from the center and having a structure by which gaps between fins can be held uniformly in flowing directions of the fluids.

It is still another object of the present invention to obtain a semiconductor cooling device capable of uniformly cooling a multiplicity of semiconductors arrayed on a board at a high efficiency.

It is a further object of the present invention to obtain heat sinks capable of reducing a loss of pressure while keeping the heat transfer performance at a high level.

It is still a further object of the present invention to obtain heat sinks capable of improving the heat transfer performance by adjusting a distribution of flow rates between the fins.

It is yet another object of the present invention to obtain a semiconductor cooling device capable of cooling the semiconductors at a high efficiency and preventing the excessive stress from acting on the semiconductors.

It is also an object of the present invention to provide a cooling device for semiconductor devices which provides a high cooling efficiency while attaining a high packaging density of the semiconductor devices, by eliminating problems relating to the temperature gradient of the cooling fluid as described in Japanese Patent Unexamined Publication No. 60-134451, as well as problems concerning the fin pitch as shown in U.S. Pat. No. 468,251.

The foregoing objects are accomplished by such an arrangement that a multiplicity of tabular fins bored with through-holes at their central parts are laminated via spacer members, and the cooling fluids introduced into these through-holes made to flow in the radial directions along the tabular fins. Preferably, the spacer members are radially disposed.

With the intention of improving the heat transmissibility of the tabular fins, an effective arrangement is that each of the tabular fins is provided with penetrating pins or formed to have a curvature in the radial direction.

In order to reduce the loss of pressure while keeping the heat transfer performance at a high level, a preferable arrangement is such that dimensions of outside diameters of the tabular fin and the spacer member are gradually diminished as they are positioned at greater distances from a bottom plate, or diameters of the through-holes pierced in the tabular fins are gradually enlarged as they are positioned at increasing distances from the bottom plate.

The purpose of ameliorating the heat transfer performance by controlling the distribution of the flow rates between the tabular fins can be attained by gradually reducing thicknesses of the spacer members as they are positioned at greater distances from the bottom plate.

An improvement in the cooling performance of a semiconductor cooling device can be achieved by an arrangement wherein each of a multiplicity of semiconductor chips or semiconductor packages mounted on a multi-layered printed board is provided with the heat sink, and the cooling fluids are supplied to the heat sinks, separately.

With a view to preventing the excessive stress from acting on the semiconductors, flexible tubes such as bellows are fitted to the heat sinks, or end surfaces of the bellows are pushed against the heat sinks, and the cooling fluids are fed via the bellows thereto.

According to one form of the invention, there is provided a semiconductor cooling device comprising: a multiplicity of semiconductors mounted on a printed board; heat sinks attached to the semiconductors and having a multiplicity of passageways for cooling fluid in directions horizontal to cooling surfaces of the semiconductors; and a header unit for supplying the cooling fluids directly to the heat sinks.

According to another form of the invention, there is provided a semiconductor cooling device comprising: a multiplicity of semiconductors mounted on a printed board; heat sinks attached to the semiconductors and having passageways for cooling fluid which introduce the cooling fluid into the heat sink in the normal direction and make the fluid flow in the horizontal direction; and a header unit for supplying the cooling fluid to the individual heat sinks.

According to still another form of the invention, there is provided a semiconductor cooling device comprising: a plurality of semiconductors mounted on a board; heat sinks attached to the respective semiconductors; a header unit for supplying the cooling fluids to the individual heat sinks; and flexible tubes, through which the heat sinks are connected to the header unit, for supplying the cooling fluids existing in the header unit to the heat sinks, characterized in that the heat sinks include a multiplicity of fins laminated via spacers and formed with through-holes bored in substantially central parts of the laminated fins in the laminating direction thereof, and the cooling fluids existing in the header unit are introduced into the through-holes of the heat sinks via the flexible tubes and flow radially in between the fins therefrom, thus cooling the semiconductors.

According to a further form of the invention, there is provided a semiconductor cooling device comprising: a multiplicity of semiconductors mounted on a board; a header unit in which the cooling fluids for cooling the semiconductors flow; flexible tubes through which the cooling fluids in the header unit flow to the respective semiconductors; end plates, contiguous to cooling surfaces of the semiconductors, for blockading the flexible tubes on the side of the semiconductors; and heat sinks attached to the end plates on the side of interiors of the tubes, characterized in that the heat sinks including a multiplicity of fins laminated in a direction vertical to cooling surfaces of the semiconductors to form gaps therebetween and formed with through-holes bored in substantially central parts of the fins in the laminating direction thereof, and the cooling fluids in the header unit are introduced into the through-holes of the heat sinks and flow radially in between the fins therefrom, thus cooling the semiconductors.

According to a fifth form of the present invention, the semiconductor cooling device includes a heat sink having parallel tabular internal fins and a nozzle having an opening extending orthogonally to the parallel fins. The nozzle is disposed substantially above the lengthwise mid portions of the parallel tabular fins. With this arrangement, it is possible to evenly distribute the flow of the cooling fluid to both longitudinal ends of the parallel fins from the longitudinal mid portions thereof.

Preferably, the upper portions of the fins near the nozzle are covered by a suitable cover member so as to prevent the distributed cooling fluid from moving away from the fins.

It is also possible to cut-away the parallel tabular fins in a staggered manner so as to produce partial turbulency in the streams of the cooling fluid, thereby suppressing development of boundary layer between the cooling fluid and the fin surfaces.

It is also possible to arrange such that the alternating units each of which is composed of the parallel tabular fins and the nozzle are orthogonal to each other so that the cooling fluid coming from the fins of a unit collides with the parallel fins of the adjacent units before discharged through openings formed in the partition wall.

According to sixth form of the present invention, the semiconductor cooling device comprises: a heat sink having internal parallel tabular fins and attached to each of integrated circuits on a printed board, a bellows-type flexible structure having a circular cross-section, the flexible structure having a nozzle of a rectangular cross-section disposed therein for jetting a refrigerant to the heat sink, the nozzle extending such that its longer axis is orthogonal to the fins so that the refrigerant is jetted in the form of a slit-like jet onto the fins.

In order to enhance the cooling effect, it is preferred to provide a cover plate which covers the heightwise ends of the fins and which is partially cut to provide an entrance for the jet flow of the refrigerant and an exit for the refrigerant.

It is also preferred that the fins are made of Si, SiC or AlN in order to reduce thermal stress which is produced at the joint between the heat sink and the semiconductor chip or package.

In this sixth form of the present invention, the heat sink functions as a vessel for defining a passage through which the cooling fluid is circulated and also as heat dissipating fins which transfers the heat generated by the integrated circuit chip to the cooling fluid.

The bellows-type flexible structure of the heat sink provides a passage for the cooling fluid discharged from the heat sink and effectively absorbs any dimensional error in the assembly of the cooling device, as well as thermal distortion. The duct provided in the flexible structure of the heat sink and having a rectangular cross-section serves as a nozzle which directs the cooling fluid in the form of a slit onto the fins inside the heat sink. This duct also has a function for preventing any deviation of the bellows-type flexible structure. The parallel tabular fins inside the heat sink define passages for the cooling fluid jetted from the above-mentioned duct, while serving as heat dissipation plates which transfer heat generated in the integrated circuit chip to the cooling fluid.

The cover plate provided on the heightwise end of the fins prevents the cooling fluid from escaping upward, thereby enhancing the cooling efficiency.

BRIEF DESCRIPTION OF THE DRAWINGS

Other objects and advantages of the present invention will become apparent during the following discussion taken in conjunction with the accompanying drawings, in which.

DESCRIPTION OF THE PREFERRED EMBODIMENTS

Figure 1:
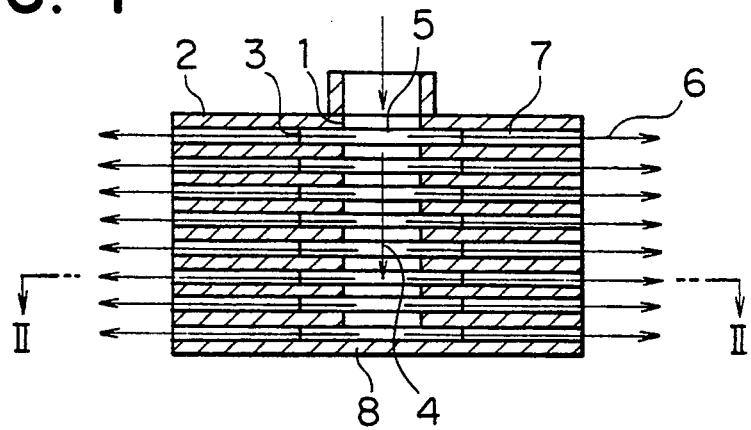
FIG. 1 is a vertical sectional view illustrating one embodiment of the present invention.
Figure 2:
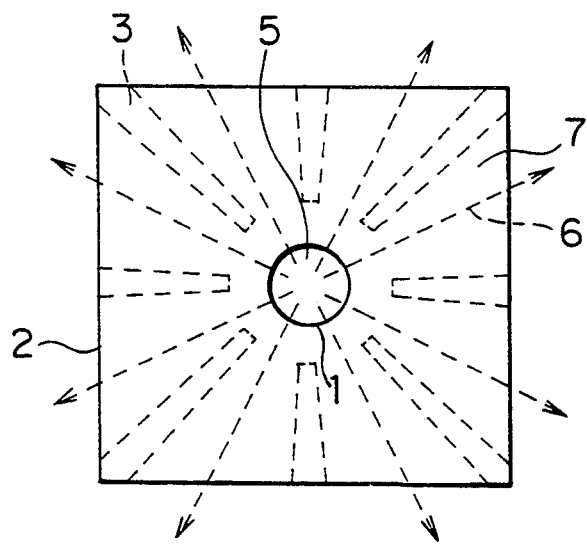
FIG. 2 is a view taken in the arrowed direction substantially along the line II—II of FIG. 1.
Figure 3:
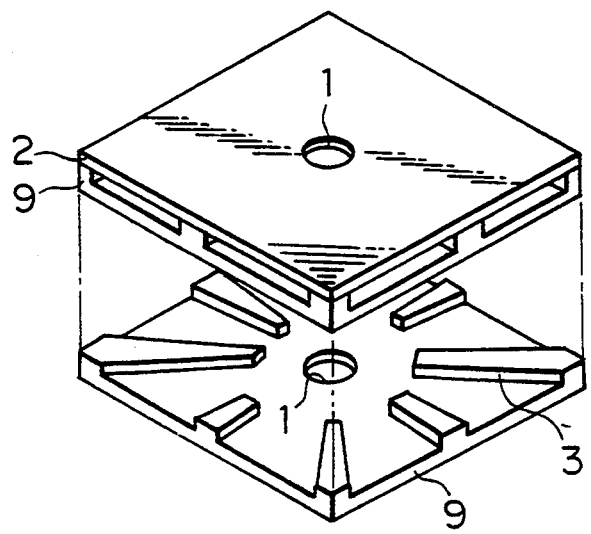
FIG. 3 is a perspective view illustrating a configuration where some parts of FIG. 1 are omitted.

One embodiment of the present invention will hereinafter be described with reference to FIGS. 1 through 3. A multiplicity of tabular fins 2 formed with through-holes 1 are laminated via radially provided spacer member 3, thus forming a heat sink. The through-holes 1 cooperate to form an axis-directional path 5 for leading a cooling fluid 4 to the central part of the heat sink. A fin 8 constituting a bottom plate of the heat sink is bored with no through-hole and serves to blockade the axis-directional path 5. The tabular fins 2 are laminated to form passageways 7 for flowing the cooling fluids 6 in the radial directions. In accordance with this embodiment, as illustrated in FIG. 3, fins 9 integrally formed with spacer member 3 are laminated, and the tabular fin 2 serving as an uppermost layer is laminated thereon, thus constituting a heat sink.

A description will next be focused on the operation of this embodiment. The cooling fluid 4 introduced into the axis-directional path 5 is deflected in the radial directions by the bottom plate 8 and flows through minute gaps 7 formed in the radial directions between the multiplicity of tabular fins. The bottom plate 8 of the heat sink in this embodiment is attached to a heat dissipating element such as a semiconductor. Heat evolved from the heat dissipating element is transferred via the bottom plate 8 to the heat sink and sequentially to the tabular fins through the spacer members 3. The heat is subsequently transferred to the cooling fluids 6 flowing in the gaps 7 therebetween from the tabular fins. The inter-fin gaps are adjusted by the spacer members 3 so that a radiating efficiency of the heat sink comes to its maximum.

Figure 4:
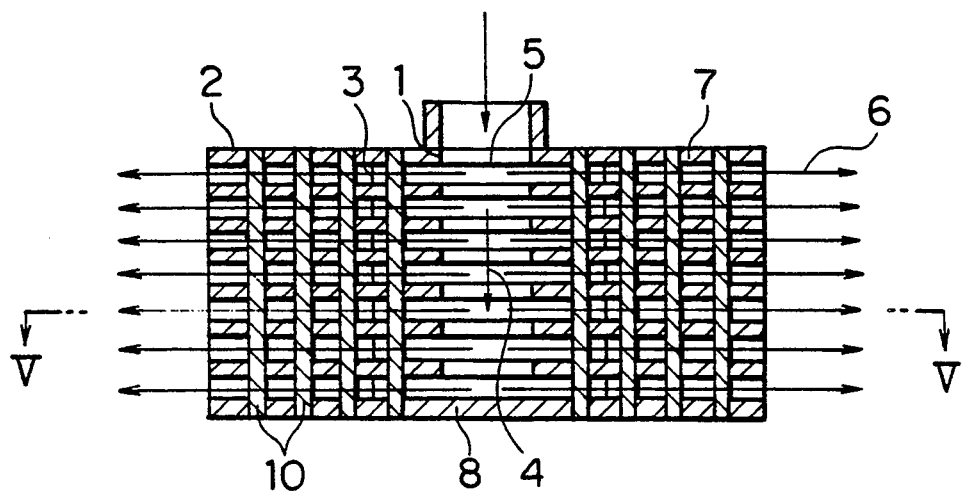
FIG. 4 is a vertical sectional view showing a structure of the present invention wherein a partial improvement is effected.
Figure 5:
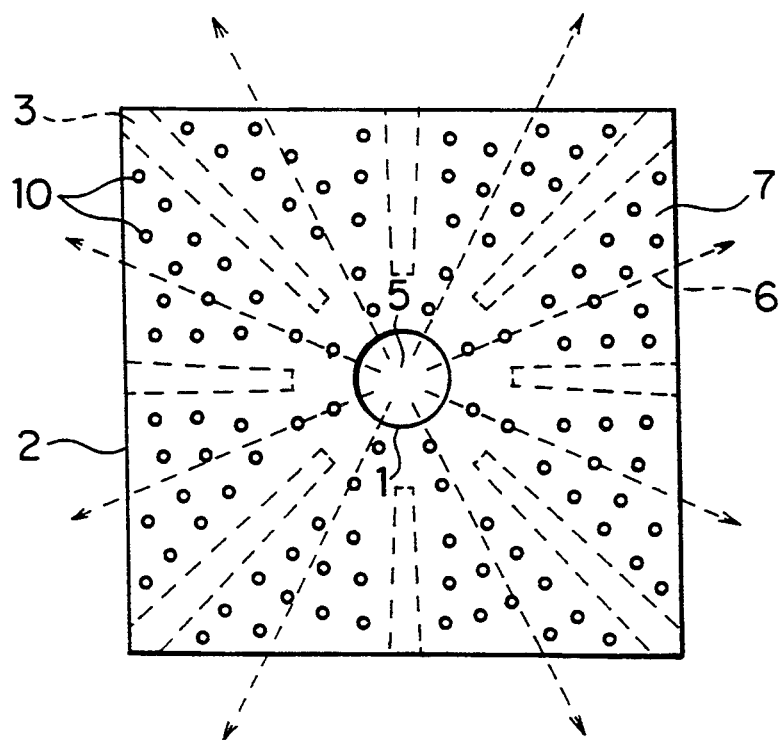
FIG. 5 is a view taken in the arrowed direction substantially along the line V—V of FIG. 4.

Turning to FIGS. 4 and 5, there is illustrated an example where the heat sink is partially improved by providing the tabular fins 2 with a multiplicity of minute penetrating pins 10. Other configurations are the same as those shown in FIGS. 1 to 3. In this example, flows of the cooling fluids in the radial directions are disturbed by the penetrating pins 10, thereby increasing a heat transmissibility of the fins to the cooling fluids. This increment in turn yields such an effect that the radiating performance of the heat sink is improved.

Figure 6:
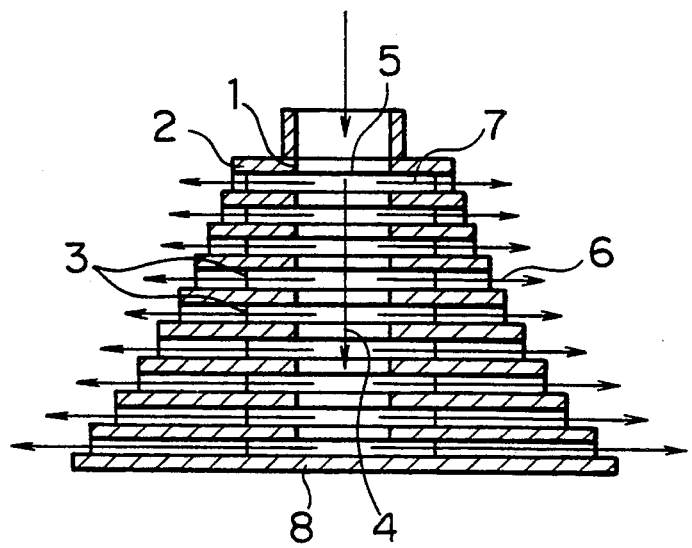
FIGS. 6 to 8 and 10 are vertical sectional views each depicting a variant form of a heat sink.

FIG. 6 shows an example where dimensions of outside diameters of the tabular fins and the tabular fins are gradually reduced as they shift farther away from the bottom plate 8. In this example, the following effects are produced. The heat transferred from the heat dissipating element to the bottom plate 8 is absorbed by the cooling fluids flowing in the radial direction sequentially from the laminated fins 2. Hence, quantities of heat transmitting the spacer members 3 and of the heat transferred from the fins 2 to the cooling fluids are reduced as the distance from the bottom plate increases. Therefore, even such an arrangement that the fins having larger areas are disposed at greater distances from the bottom plate 8 makes a less contribution to the radiating performance. On the contrary, a loss of pressure by which to flow the cooling fluids becomes large, resulting in a drop in the radiating efficiency of the heat sink. This example, however, exhibits a effect in which it is possible to decrease the loss of pressure with almost no decline of the radiating performance and improve the radiating efficiency of the heat sink because of the arrangement that the areas of the tabular fins 2 and the spacer members 3 are sequentially diminished as those components are disposed at increasing distances from the bottom plate 8.

Figure 7:
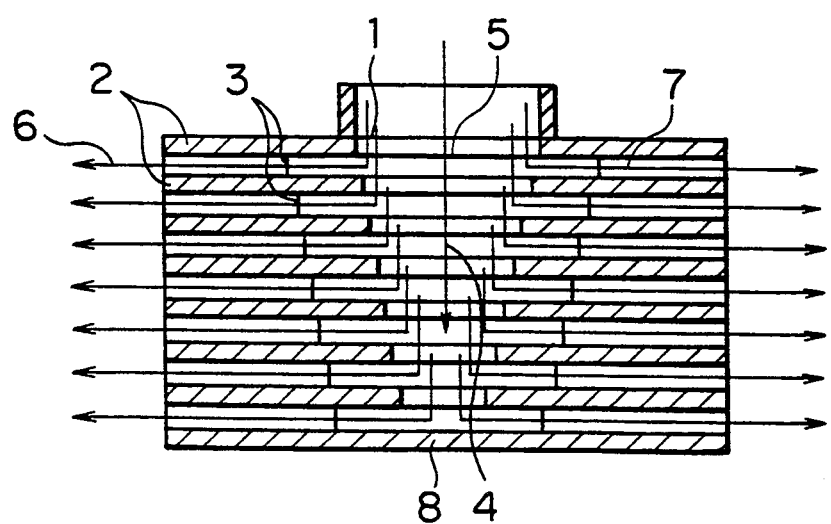

Referring to FIG. 7, there is illustrated an example where diameters of the through-holes 1 bored in the tabular fins 2 are sequentially enlarged as they are located at greater distances from the bottom plate 8. By virtue of this configuration, the areas of the tabular fins and of the spacer member 3 are reduced as they are disposed farther away from the bottom plate 8. As a result, the same effect can be obtained. This example further exhibits the following peculiar effects. Since the diameters of the through-holes 1 are gradually reduced in the direction of the axis-directional flow 4 of the cooling fluid introduced into the heat sink, inner peripheral parts of the tabular fins 2 are sequentially protruded into the axis-directional flow 4, and it follows that the flow 4 impinges sequentially on the protrusions thereof. Momentum acting in the axial direction which include the axis-directional flow are converted sequentially into momentum acting in the radial direction. It is therefore possible to control flow rates of the radial flows between the laminated fins by controlling quantities of the protrusions. (i.e., the diameters of the through-holes). The protrusion quantities are controlled so that the cooling fluids flow at higher flow rates in closer positions to the bottom plate, viz., in such positions to provide greater quantity of the heat to be absorbed by the cooling fluids, thereby improving the radiating efficiency of the heat sink. There is obtained a heat sink exhibiting the same effect even by gradually decreasing the thicknesses of the spacer member 3 according as they shift farther away from the bottom plate 8.

Figure 8:
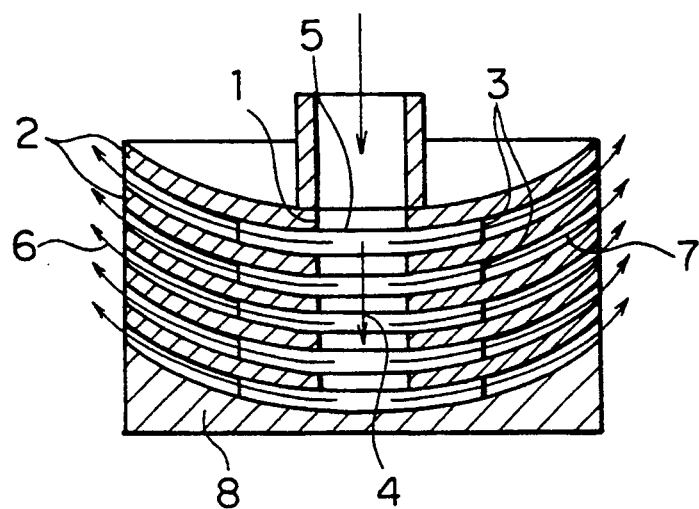
Figure 9:
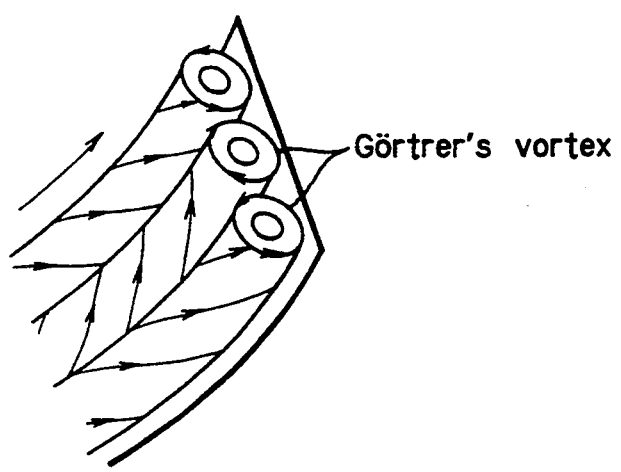
FIG. 9 is a diagram of assistance in explaining the principle in the example shown in FIG. 8.

Turning to FIG. 8, there is shown an example in which the tabular fins 2 are formed to have curvatures to assume a spherical surface. This configuration causes centrifugal forces to act on the radial flows, with the result that, as illustrated in FIG. 9, vertical vortices known as Görtrer's vortex are produced. In consequence, the radiating performance can be ameliorated due to an increment in the heat transmissibility between the fin and the cooling fluid.

Figure 10:
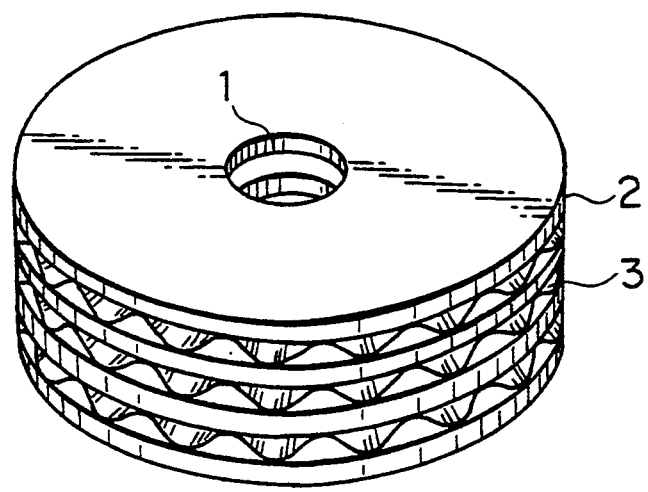
Figure 11:
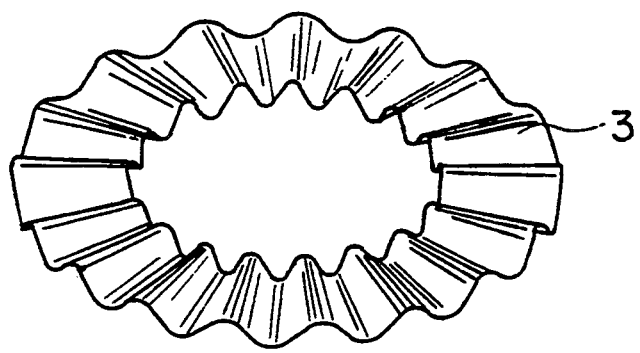
FIG. 11 is a perspective view showing a structure of spacer members depicted in FIG. 10.

An illustrative arrangement of FIG. 10 is that the spacer member 3 is formed of an annular undulate plate depicted in FIG. 11. Thus formed spacer members 3 are, as illustrated in FIG. 10, bonded to the tabular fins 2, thus constructing a heat sink. In this example, there is created an advantage of reducing costs for manufacturing the heat sinks on account of the fact that the spacer members can be shaped by press machining.

Figure 12:
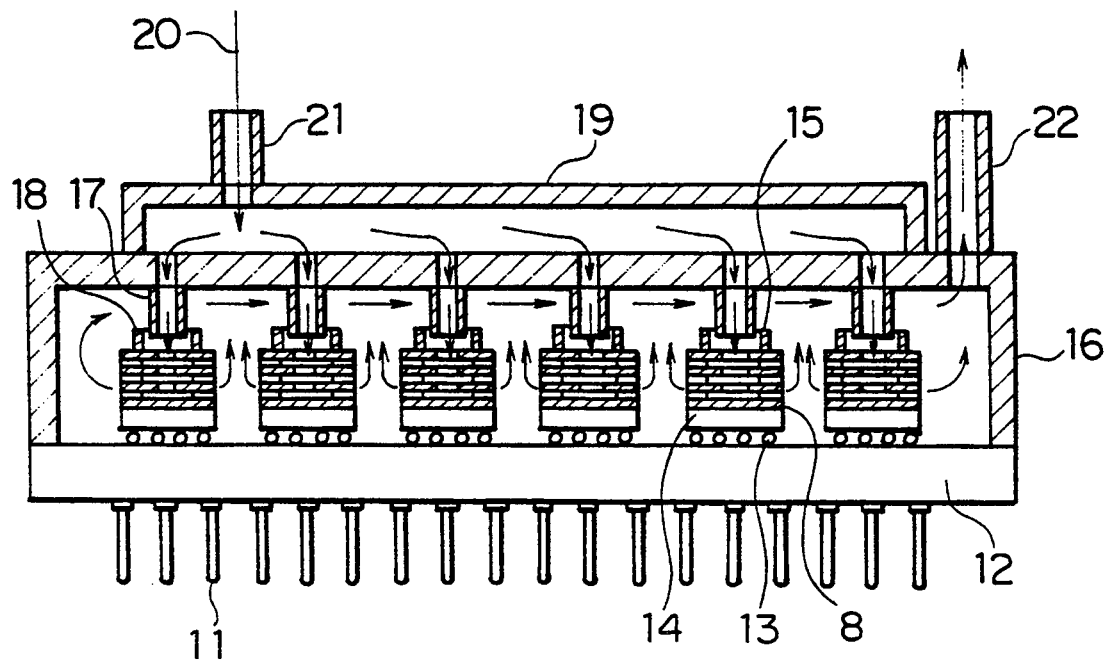
FIGS. 12 and 13 are vertical sectional views each showing an embodiment of a semiconductor cooling device in which the heat sink of the invention is applied to a semiconductor device.

FIG. 12 shows one example of a semiconductor cooling device, wherein the heat sinks of the present invention are applied to cooling of integrated circuit chips. A multiplicity of integrated circuit chips (semiconductors) 14 are mounted via minute solder bumps on a ceramic multilayered printed board 12 including a multiplicity of I/O pins 11. Heat sinks according to the present invention are soldered via the bottom plates 8 to the integrated circuit chips 14. A chip mounting surface of the multilayered printed board 12 is covered tightly with a housing 16. The housing 16 is equipped with nozzles 17, located in positions corresponding to the integrated circuit chips, for supplying the cooling fluids. An adapter is fitted to each heat sink 15 with a small gap from the nozzle 17. The housing 16 is double-structured, wherein a header unit 19 for distributing the cooling fluids to the individual nozzles 17 is mounted on an upper part of the housing 16. The header unit 19 is formed with an inlet 21 for feeding a cooling fluid 20 and with an outlet 22 for discharging the cooling fluid. The cooling fluid preferably involves the use of, e.g., fluoro carbon.

A descriptive emphasis will next be placed on the operation of this embodiment. The cooling fluid 20 fed to the header unit is distributed to the nozzles 17, respectively. The cooling fluids are further fed therefrom to the heat sinks 15, individually. The heat sinks 15 are supplied with the cooling fluids via the adapters 18 fitted thereto with the minute gaps from outside-diametrical parts of the nozzles 17. These gaps are set enough to absorb thermal deformation caused by an assembly tolerance and a difference in expansion coefficient between the multi-layered printed board 12 and the housing 16. The cooling fluids fed to the heat sinks 15 then flow in the radial directions within the heat sinks and work to absorb the heat dissipated from the integrated circuit chips 14. The cooling fluids flowing out of the heat sinks 15 in the radial directions run through an interior of closed space confined by the housing 16 in cooperation with the board 12 and are discharged from the outlet 22 formed in the housing 16. In accordance with this embodiment, the cooling fluids are supplied to the heat sinks 15, individually, thereby uniformly cooling the integrated circuit chips and eliminating a malfunction of the element which is derived from a scatter in temperature between the chips. Besides, according to the present invention, the radiating performance of the heat sink increases because of employing the heat sink including the laminated fins for permitting the cooling fluids to flow in the radial directions; and even hyperdensity heat dissipating chips of the order of several tens watts can be cooled.

Figure 13:
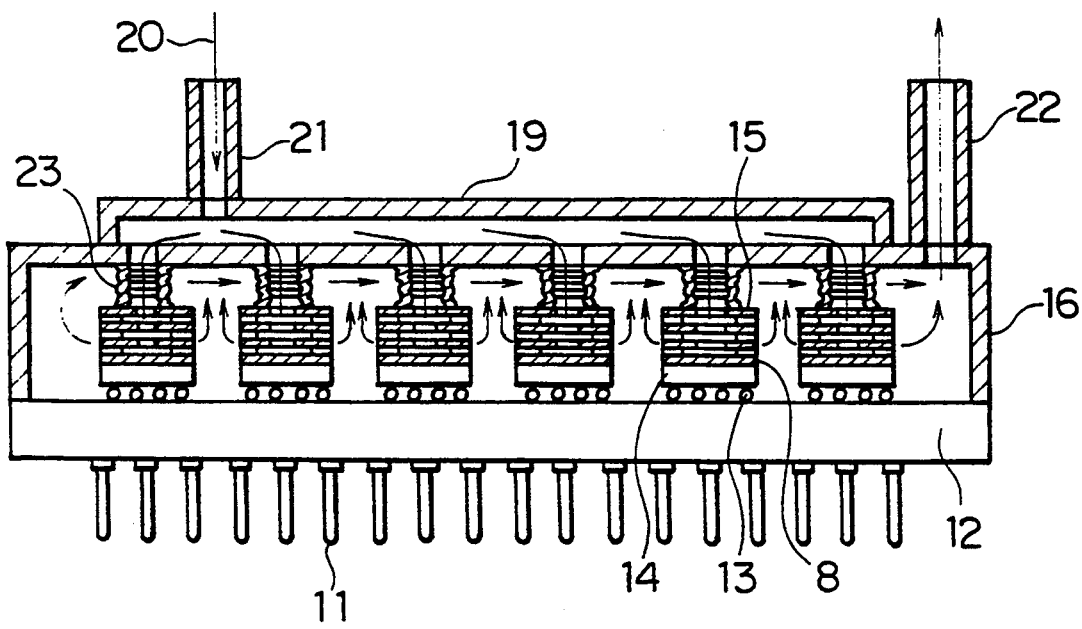

Referring to FIG. 13, there is shown an example where the configuration of FIG. 12 is partially modified. The heat sinks 15 are connected via bellows tubes 23 to the housing 16. With this arrangement, a deformation caused by the assembly tolerance and the difference in the thermal expansion coefficient between the board 12 and the housing 16 can be absorbed owing to the bellows. It is feasible to feed the cooling fluids to the heat sinks with a higher certainly without exerting the excessive stress to the minute solder bumps 13 through which the chips are connected to the board 12.

Figure 14:
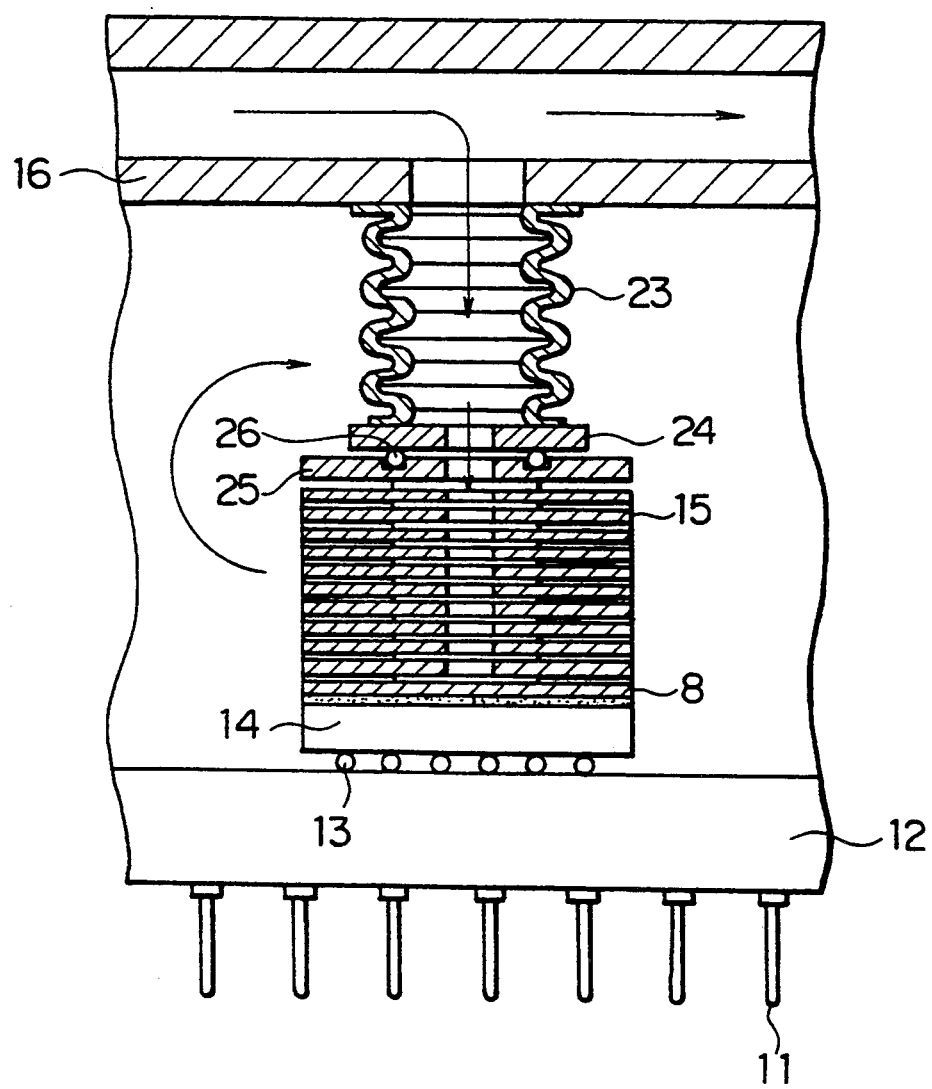
FIGS. 14 through 16 are enlarged sectional principal views showing other variant forms of the semiconductor cooling device of the invention.

FIG. 14 illustrates an example of a partially variant form of the configuration of FIG. 13. The configuration is fundamentally the same as that in FIG. 13. Additional components are flanges 24 provided at the ends of the bellows tubes 23 and 0-rings 26 fitted to uppermost tabular fins 25 of the heat sinks 15. The flanges 24 are pushed against the 0-rings 25 by spring forces of the bellows tubes 23. In this example, it is possible to remarkably improve an assembling property when mounting the housing 16 on the multi-layered printed board 12.

Figure 15:
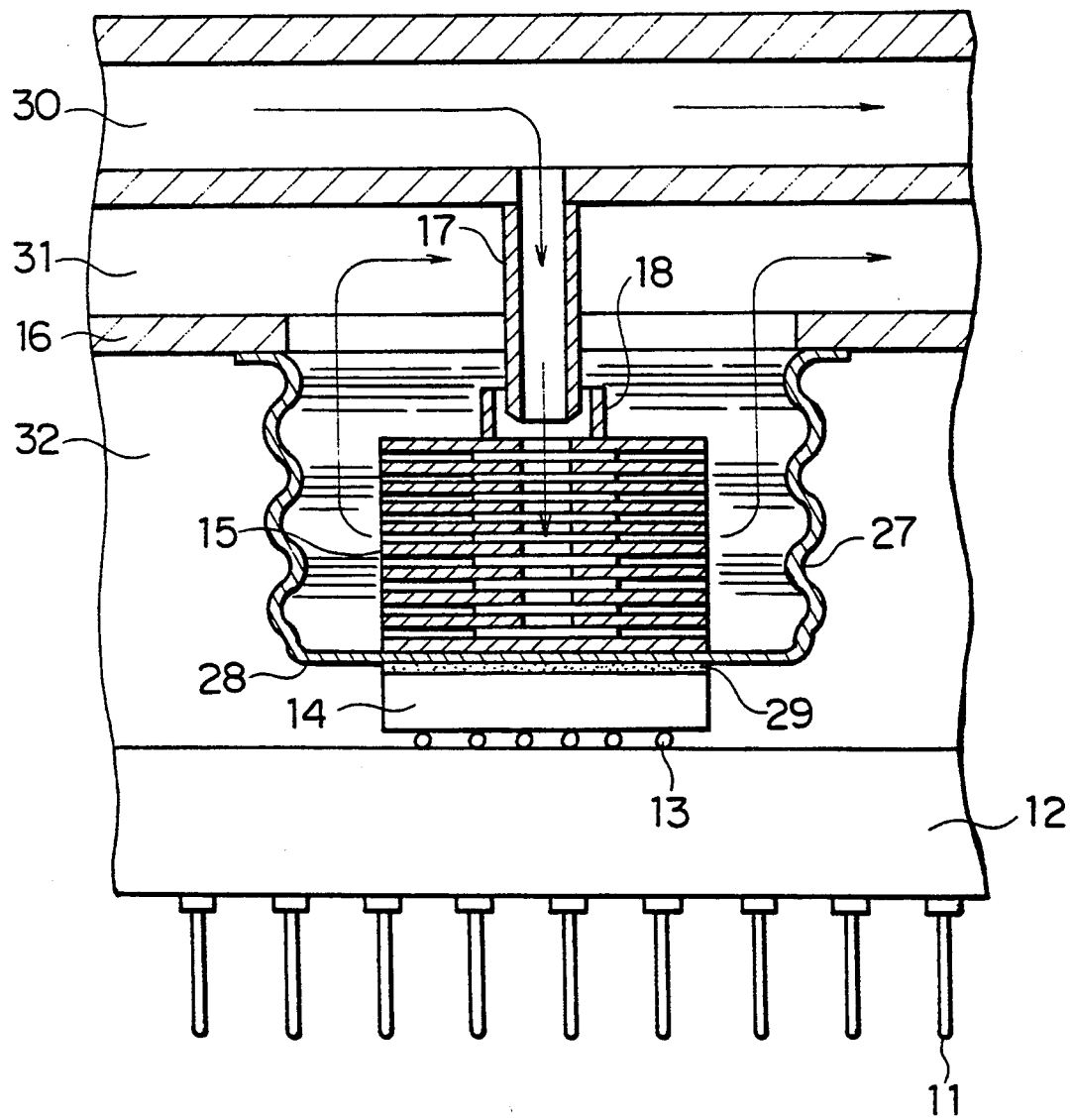

FIG. 15 illustrates a partially varied example of the configuration depicted in FIG. 12. Based on the construction of FIG. 12, each of the heat sinks 15 according to the present invention is contained in a bellows 27 having an end plate 28 joined to the integrated circuit chip 14 with a solder 29. Note that in this example the end plate 28 of the bellows is joined to the integrated circuit chip but may simply contact it without being jointed thereto. According to the present invention, the fluids flow fundamentally in the radial directions (the flows symmetric with respect to the axis) within the heat sink 15, so that the bellows 27 may be formed of an excellently flexible material to assume a circular shape in section. Hence, even though the end plate 28 of the bellows is joined to a rear surface of the integrated circuit chip 14, the bellows 27 is capable of sufficiently absorbing the deformation ascribed to the assembly tolerance as well as to the difference in thermal expansion coefficient between the printed board 12 and the housing 16, thereby applying no excessive stress to the solder bumps 13. The housing 16 is triple-structured, wherein there are formed a space 30 for supplying the cooling fluid, a space 31 for discharging the cooling fluid and a space 32 which is filled with an inert gas so as to seal the chip-mounting surface against ambient air. In this example, the cooling fluids do not directly contact the integrated circuit chips 14, and hence a fluid like water having a high cooling capability is usable to improve the radiating effect.

Figure 16:
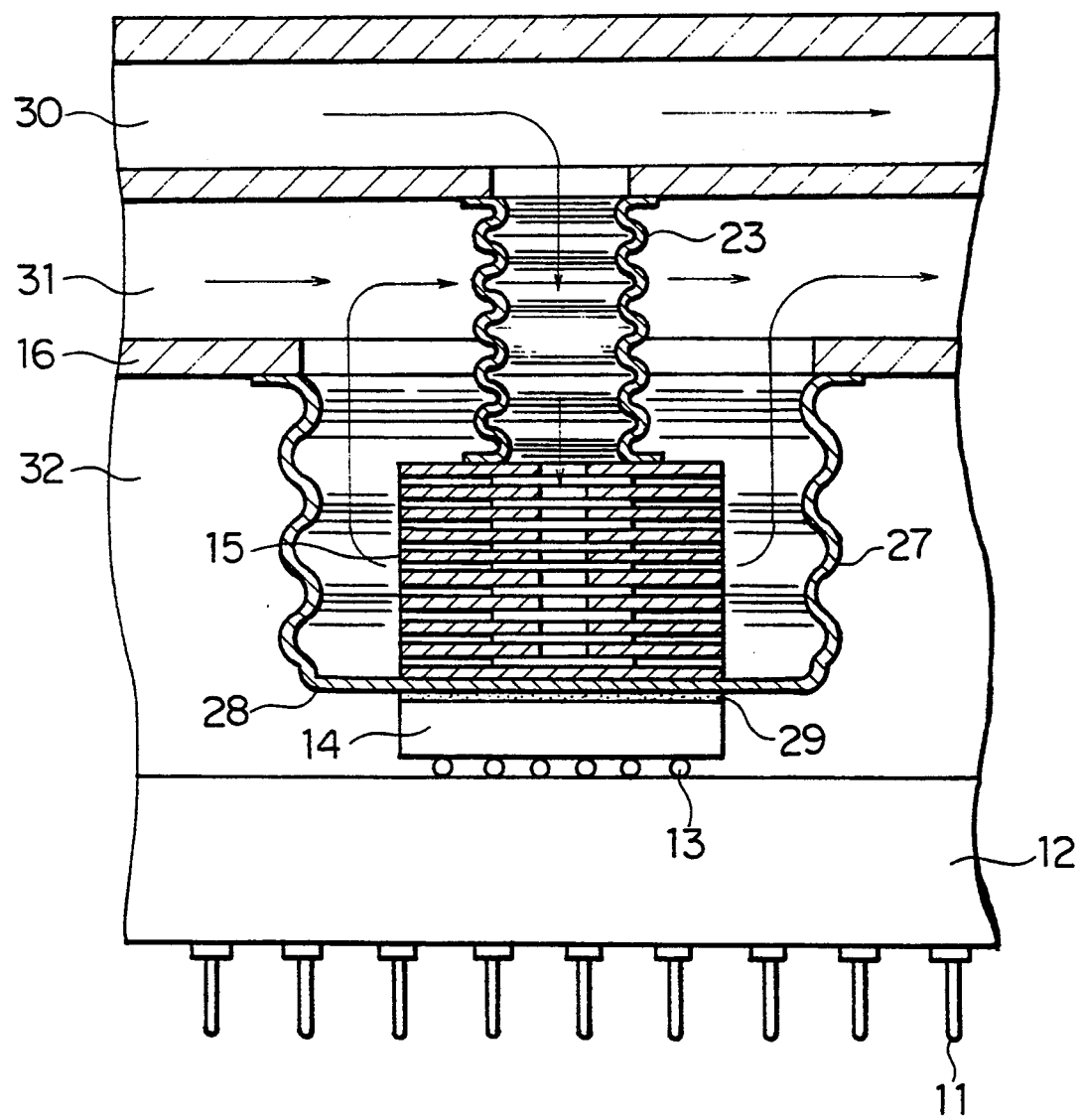

FIG. 16 is a diagram illustrating still another variant form of the present invention. Based on the configuration of FIG. 13, the bellows 27 including the end plate 28 contains the heat sink 15 of the present invention, and the end plate 28 of the bellows is joined to the rear surface of the integrated circuit chip 14. The fluid flows fundamentally in the radial direction in symmetry with respect to the axis within the heat sink 15, so that the bellows 23 for supplying the cooling fluid and the bellows 27 for discharging the cooling fluid can be disposed concentrically. Hence, each of the bellows 23 and 27 may be composed of a highly flexible material to assume the circular shape in section. Even when joining the end plate 28 to the rear surface of the integrated circuit chip 14, the thermal deformation attributed to the assembly tolerance and the difference in expansion coefficient between the printed board 12 and the housing 16 is well absorbably by those bellows. Consequently, no excessive stress acts on the solder bumps 13. As compared with the example of FIG. 15, the arrangement depicted in FIG. 16 exhibits such an advantage that the cooling fluid can be supplied more surely to the respective heat sinks 15.

In accordance with the embodiment discussed above, the cooling fluid flows in the radial direction in symmetry with respect to the axis within the heat sink, whereby deflective flows are hard to occur even when feeding a good deal of cooling fluids into the heat sinks with a considerably high radiating performance. In the embodiments given above, the fins are laminated in a direction vertical to the cooling surfaces, thereby obtaining larger heat transfer areas. Besides, the spacer members perform a function of a heat transfer route in the axial directions, whereby the fin efficiency increases. The high radiating performance can therefore be obtained.

According to the semiconductor cooling device employing the heat sinks of the present invention, the cooling fluids can be supplied to the heat sinks in the direction of the central axis of the heat sink with the aid of tubes each having a relatively small diameter. For this reason, the cooling fluids of a low temperature can be fed uniformly to the multiplicity of integrated circuit chips mounted on the multi-layered printed board. Moreover, in accordance with the present invention, the cooling fluids flow out of the heat sinks in symmetry with respect to the axis, and the cooling fluids can thereby be supplied and discharged through the concentric tubes. If attached via, e.g., partition walls like bellows to the integrated circuit chips, the highly flexible bellows each assuming the circular shape in section are usable, and it is therefore possible to effect the attachment without causing the excessive stress on the integrated circuit chips. Hence, a fluid, as in the case of water, having a high cooling capability but exhibiting a poor electric insulating property is also usable.

Figure 17:
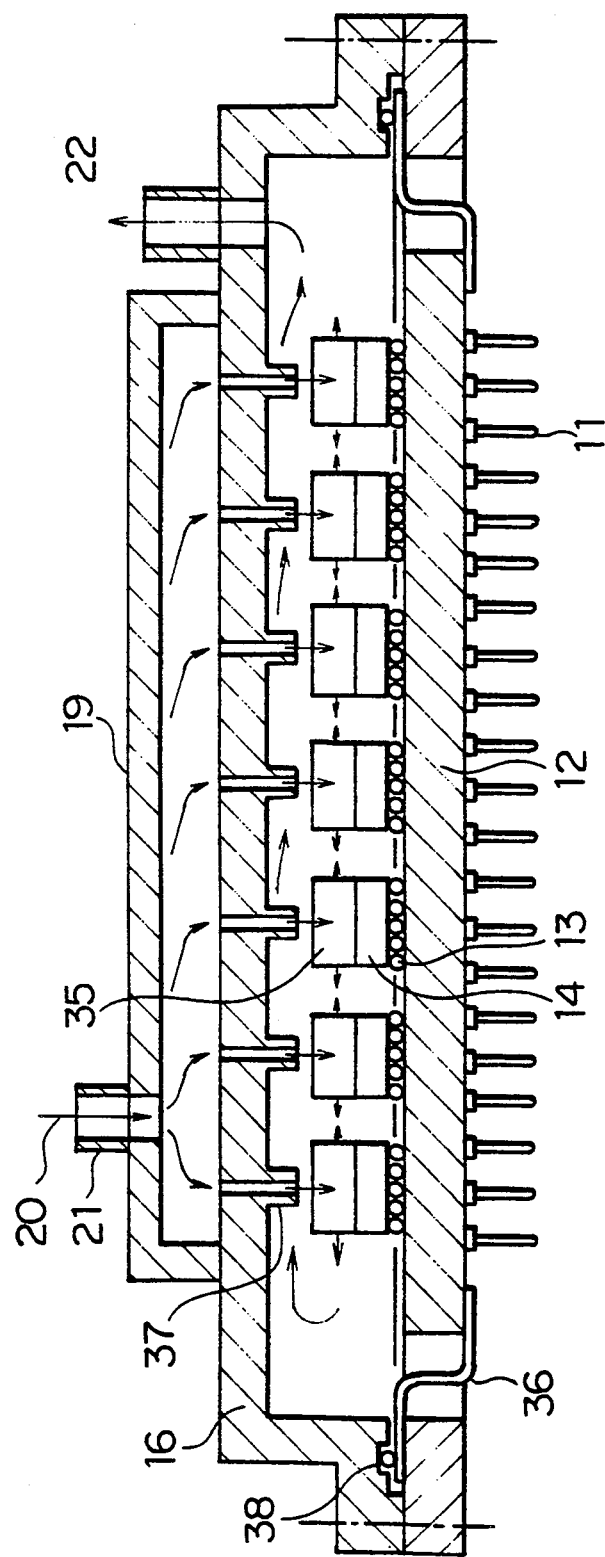
FIG. 17 is a vertical sectional view showing another embodiment of the device according to the present invention.
Figure 18:
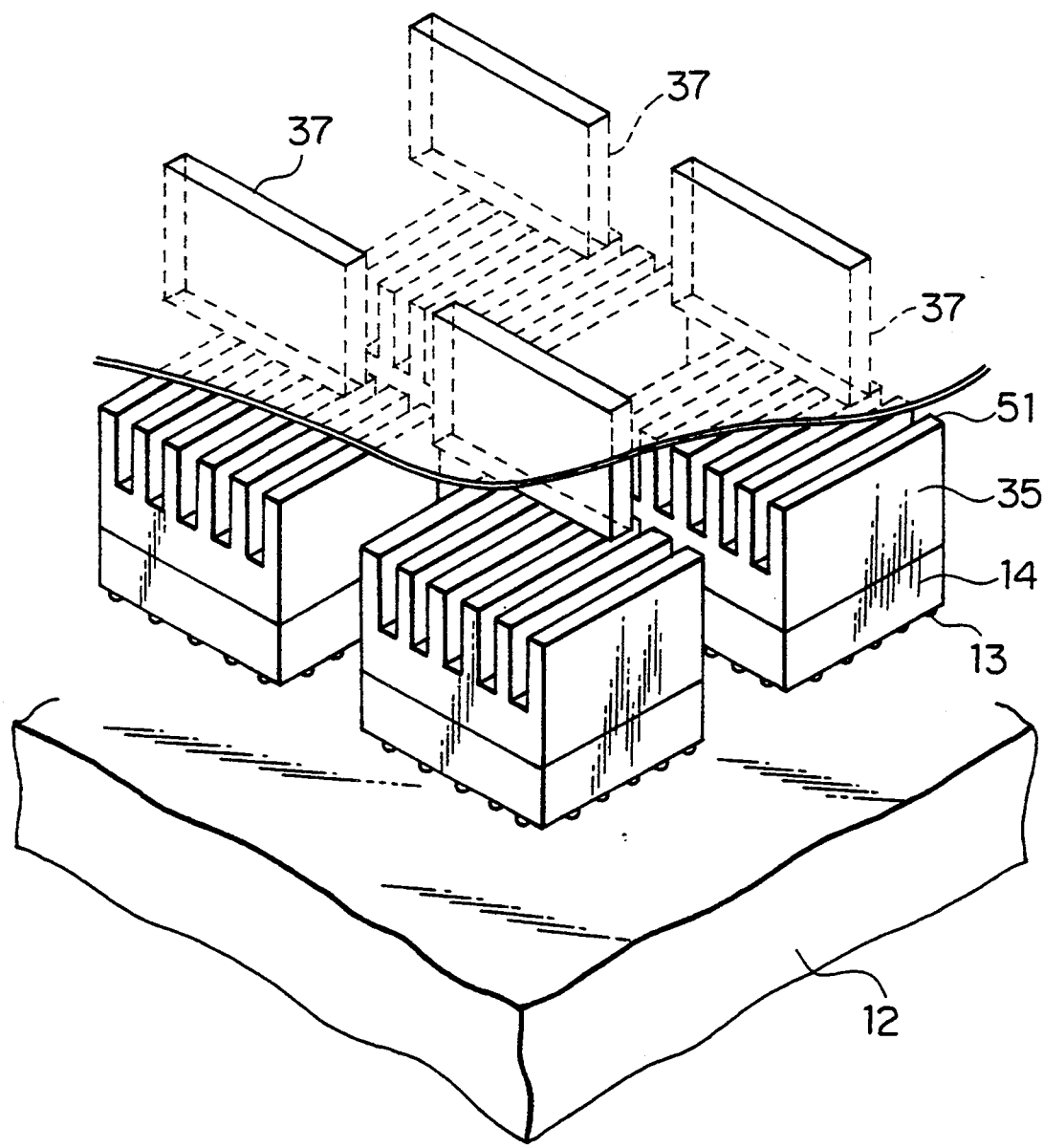
FIG. 18 is a perspective view illustrating the principal portion of FIG. 17.

Turning to FIG. 17, there is shown a further embodiment of the present invention. The multiplicity of integrated circuit chips (or packages) 14 are mounted via the minute solder bumps 13 on the ceramic multi-layered printed board 12 provided with a multiplicity of I/O pins 11. Attached to the integrated circuit chips 14 are heat sinks 35 having a plurality of fins 51 (see FIG. 18). A chip mounting surface of the multi-layered printed board 12 is tightly covered with the housing 16 through 0-rings 38. The housing 16 is provided with slit-like nozzles 37 disposed vis-a-vis with the upper parts of the integrated circuit chips. The nozzle 37 is, as depicted in FIG. 18, orthogonal to the central line of the fins 51 incorporated in the heat sink 35 and extends over the entire width of a group of fins 51. As illustrated in FIG. 17, the housing 16 is double-structured, wherein the header unit 19 is provided upwards for distributing the cooling fluid 20 such as fluoro carbon to the nozzles 37. The housing 16 is bored with the inlet 21 for supplying the cooling fluid 20 and the outlet 22 for discharging the cooling fluid.

The cooling fluid 20 into which the header unit 19 is distributed to the slit-like nozzles 37, and the thus distributed fluids are fed to the heat sinks 35 fitted to the integrated circuit chips 14. As a result, the cooling fluids 20, as indicated by arrows 110 of FIG. 19, enter the central interiors of a group of fins 51 and are split in two directions along the fins 51, thus absorbing the heat dissipated from the integrated circuit chips 14. The cooling fluids 20, as indicated by arrows 111, flowing out of the group of fins move into a closed space defined by the housing 16 and the multi-layered printed board 12 and are discharged from the outlet 22. In this embodiment, the respective integrated circuit chips are supplied with the cooling fluids, with the result that a temperature-difference, as incidental to the prior arts, between the upstream and the downstream of the cooling fluids can not be seen. Thus, temperatures of the integrated circuit chips become uniform, and it is therefore feasible to prevent the malfunction of the element which is, as in the way with the prior arts, caused due to the scatter in temperature between the integrated circuit chips. The cooling fluids 20 are blown on all of the plurality of the fins, thus uniformly distributing the cooling fluids in between the fins. The flows of the cooling fluids are deflective in bilateral directions from the central parts of the fins. A length of the passageway formed between the fins becomes one-half of a fin width, and the loss of fluid pressure can be reduced by approximately a factor of 4. The cooling capability can easily be improved by causing an increment in the flow rate.

As a result, on the basis of the construction of this embodiment, the cooling process can be performed while packaging the integrated circuit chips with a high density, an electric power consumption of which is of the order of several tens watts.

Figure 20:
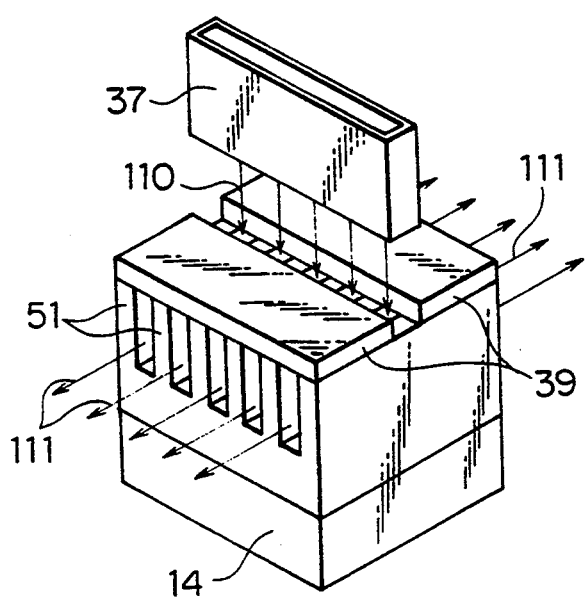
FIG. 20 is a perspective view showing an improved example of the heat sink depicted in FIG. 17.

FIG. 20 shows an improved version of the embodiment depicted in FIG. 17. Cover plates 39 are, as illustrated in FIG. 20, covered on the fins 51 with the intention of preventing escape of the cooling fluids 20 from the upper parts of the fins 51, thus improving the cooling efficiency.

Figure 21:
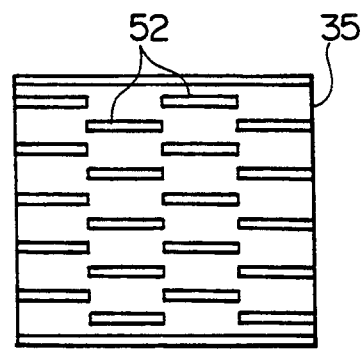
FIG. 21 is a plan view showing a partially variant form of the heat sink depicted in FIG. 17.

Turning to FIG. 21, there is shown a partially variant form of the embodiment illustrated in FIG. 17. The fins 51 are split into fin elements 52 which are in turn, as illustrated in FIG. 21, arrayed alternately. This arrangement makes it difficult to develop thermal boundary layers in the cooling fluids 20 flowing in between the fin elements 52. Consequently, some effects are obtained, wherein the heat transmissibility from the fin elements 52 to the cooling fluids is ameliorated, and the cooling efficiency is thereby increased.

Figure 19:
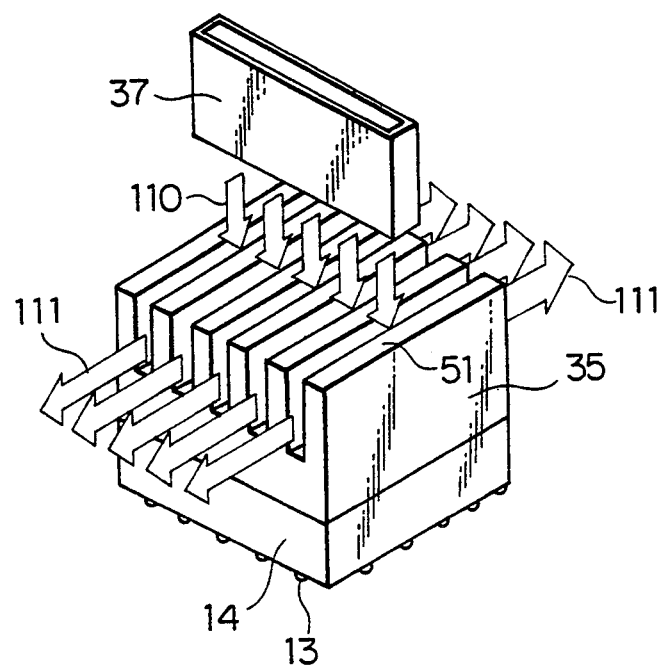
FIG. 19 is a perspective view of assistance in explaining flows of cooling fluids in the embodiment of FIG. 17.
Figure 22:
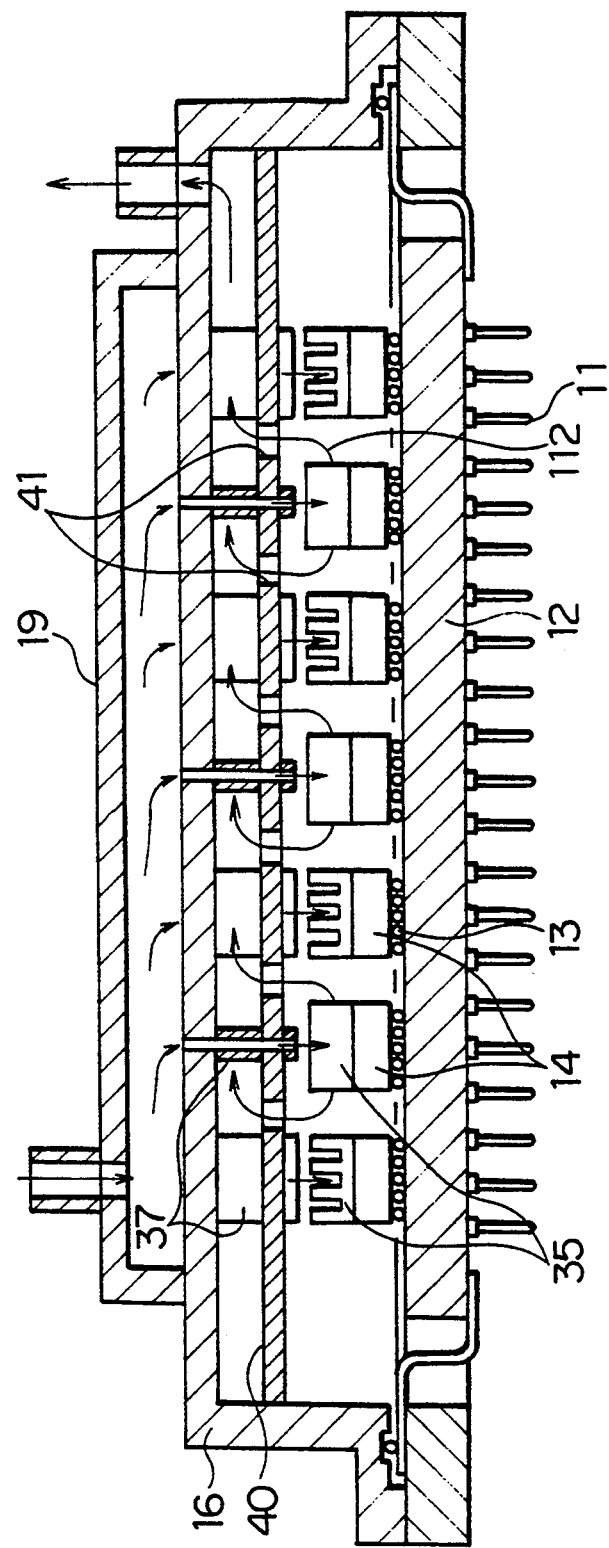
FIG. 22 is a vertical sectional view showing still another embodiment of the device according to the present invention.
Figure 23:
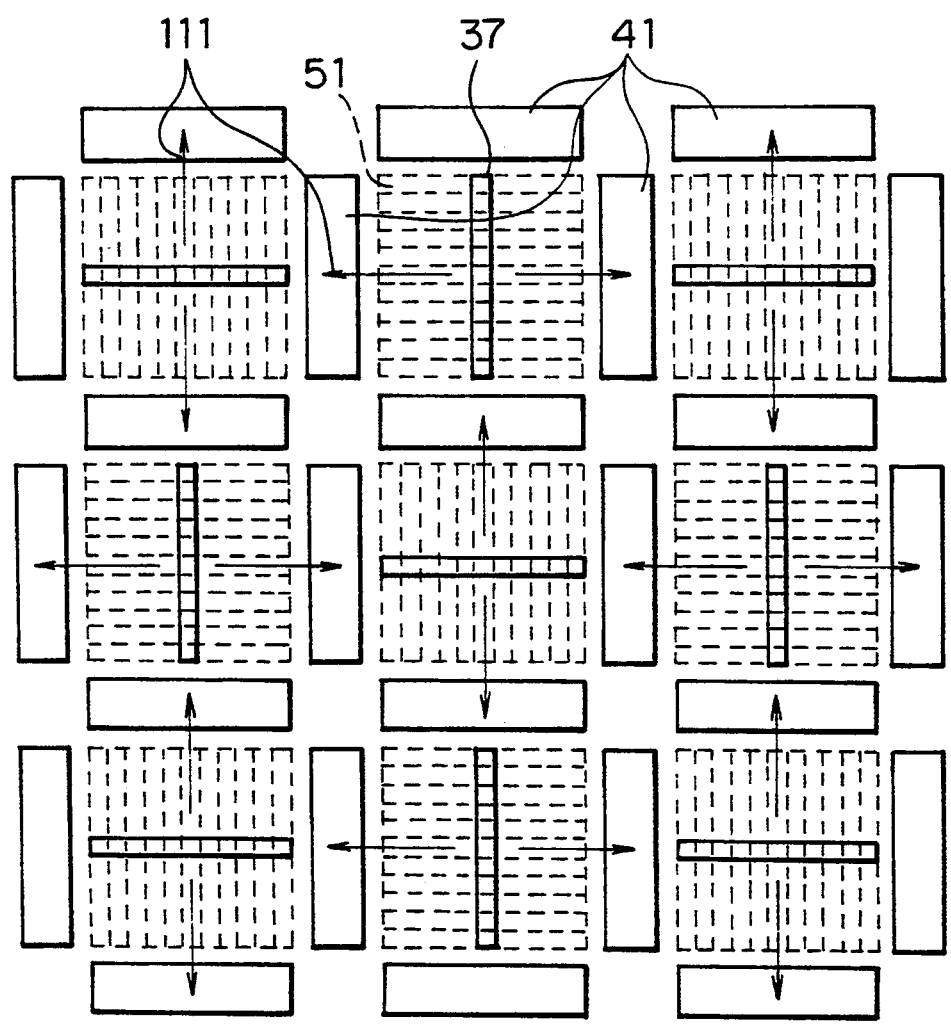
FIG. 23 is a plan view illustrating the principal portion of the embodiment of FIG. 22.
Figure 24:
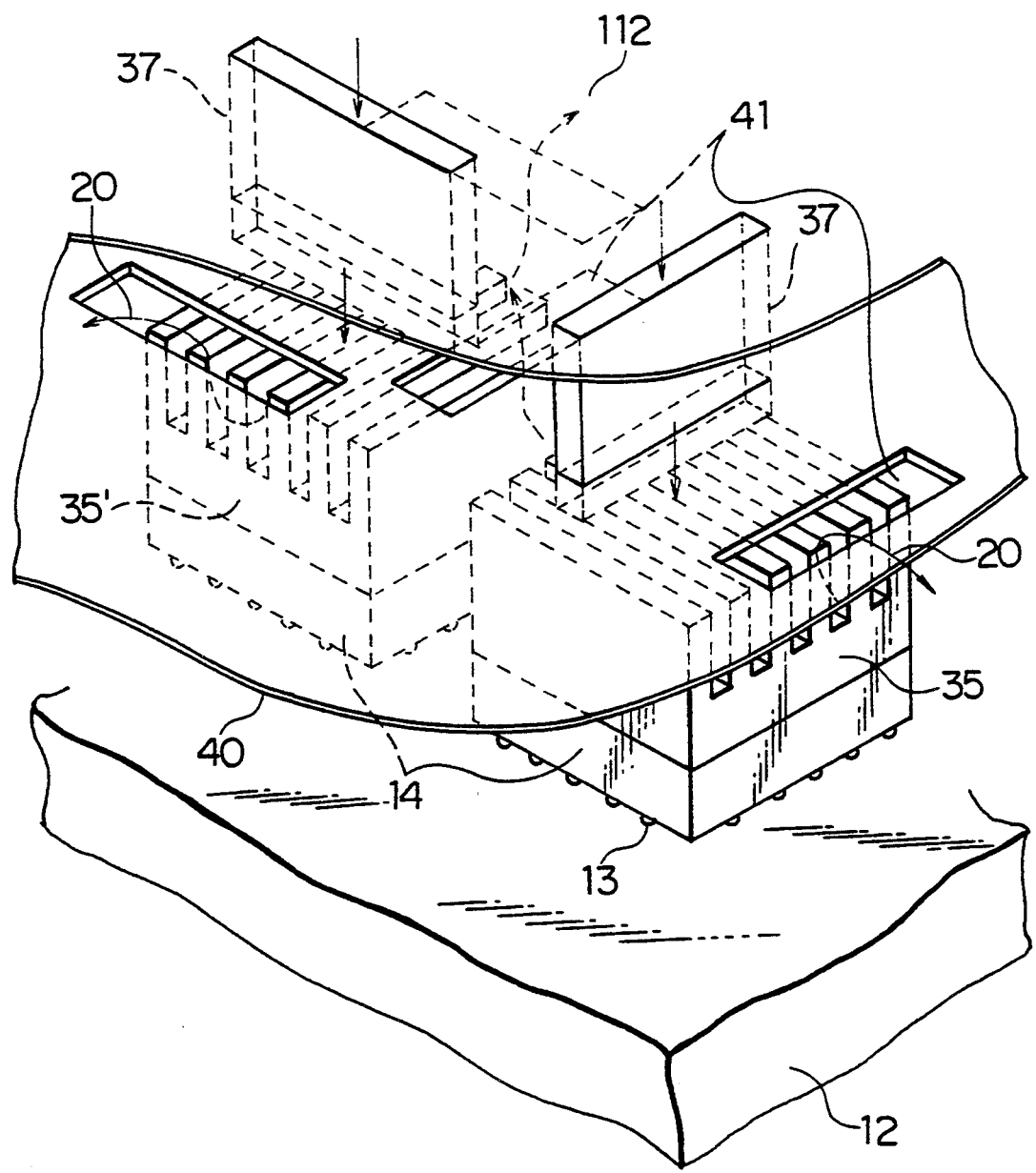
FIG. 24 is a perspective principal view of assistance in explaining the flows of the cooling liquids in the embodiment of FIG. 22.

Referring to FIGS. 22 through 24, there are exemplified further improvements of the embodiments shown in FIGS. 17 through 19. Turning to FIG. 22, the nozzles 37 illustrated in FIG. 17 are so disposed as to be alternately orthogonal to each other, and at the same time a partition wall 40 is formed in the housing 16. Bored in the partition wall 40 are outflow holes 41 for discharging the cooling fluids 20 by twos for every integrated circuit chip 14.

FIG. 23 is a plan view depicting an interior of the device of FIG. 22. The outflow hole 41 has a width substantially equivalent to that of the integrated circuit chip 14, and its depth is set almost equal to an interval between the integrated circuit chips. The cooling fluids 20 passing through between the fins from the nozzles 37 flow out in the arrowed directions 111 and are uniformly smoothly sucked as indicated by arrows 112 of FIG. 22.

FIG. 24 is a perspective view illustrating a part of the interior of the device of FIG. 22. The cooling fluids fed from the nozzles 37, as shown in FIG. 24, flow bilaterally between the fins of the heat sink 35 and then impinge on the fins of a heat sink 35' adjacent thereto. The cooling fluids flow out via the outflow holes 41 formed just above the heat sinks, thereby smoothing the flows of the cooling fluids with no interference with each other. The outflow holes 41 are provided in close proximity to the fins 51, as a consequence of which the pressure loss is minimized. While on the other hand, a good deal of cooling fluids are allowed to flow, and the cooling efficiency can thereby be enhanced.

It is to be noted that the differences in temperature between the fins can be made uniform by, if necessary, arbitrarily setting the spacings between the parallel tabular fins and lengths thereof.

Figure 25:
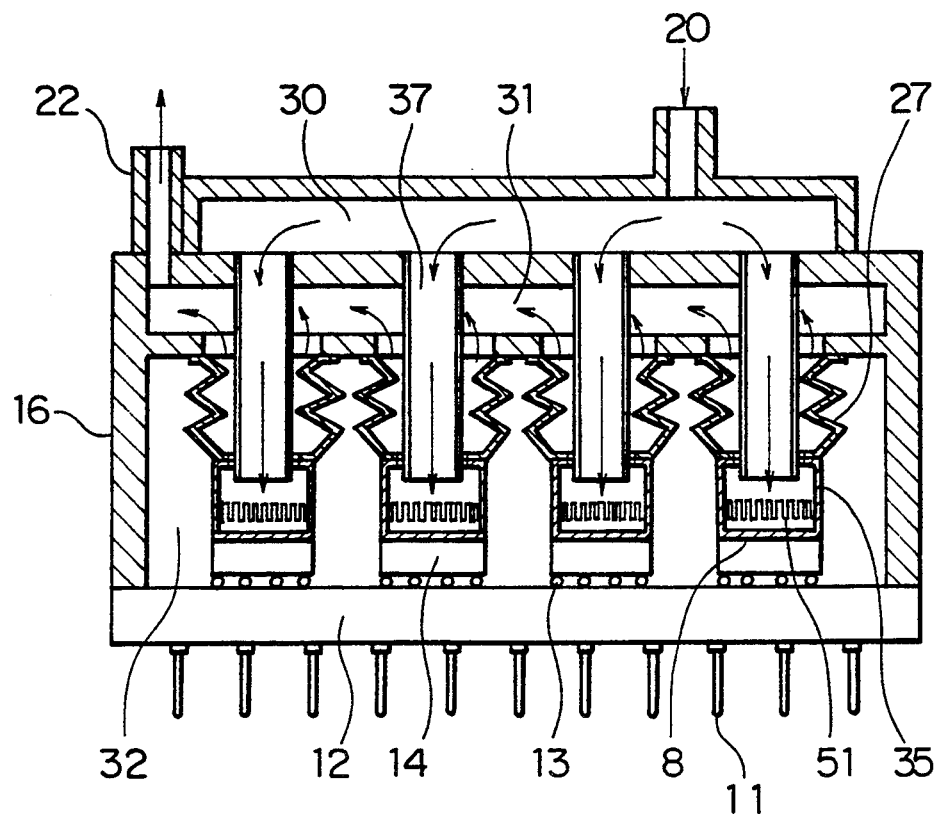
FIG. 25 is a vertical sectional view of a different embodiment of the present invention.

FIG. 25 shows a yet further embodiment of the present invention. A multiplicity of integrated circuit chips 14 are mounted through solder bumps 13 on a multi-layered ceramics printed board 12 having a number of input/output pins 11. A heat sink 35 is held in contact with or connected to each integrated circuit chip 14. The chip-mounting surface of the multi-layered printed board is hermetically sealed by means of a housing 16. The housing has a triple-walled structure which defines an inlet space 30 through which the cooling fluid is supplied, an outlet space 31 through which the cooling fluid is discharged and a space 32 which is filled with an inert gas so as to seal the chip-mounting surface against ambient air. Nozzles 37 are provided in the wall defining the inlet space 30 at positions corresponding to the integrated circuit chips so as to supply the cooling fluid to the respective heat sinks 35. A plurality of bellows 27, which define discharge passages for the cooling fluid, are connected to portions of the wall defining the outlet space 31 corresponding to the respective integrated circuit chips. The outlet space 31 is communicated with the heat sinks 35 through the passages defined by these bellows 27.

Figure 26:
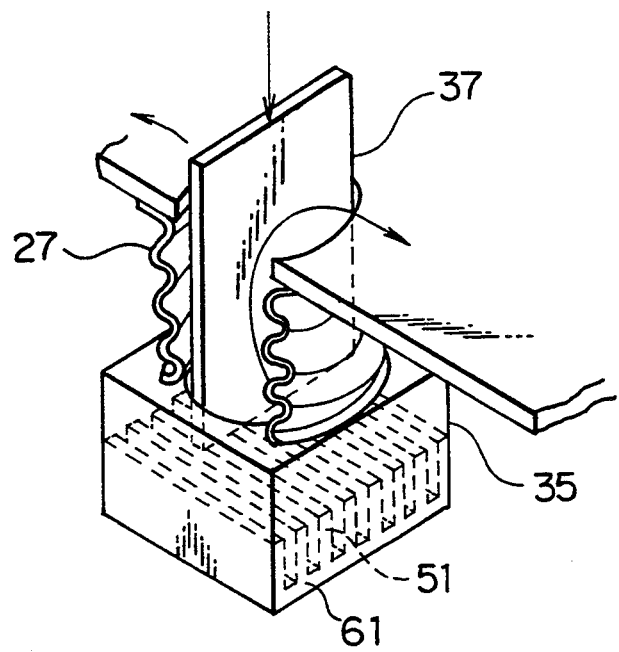
FIG. 26 is a perspective view of a heat sink incorporated in the embodiment of FIG. 25.

The heat sink 35 is a parallelepiped vessel which is provided therein with parallel tabular fins 51 as shown in FIG. 26. The nozzle 37, which has a rectangular cross-section, is disposed such that the longer axis of the rectangular cross-section thereof extends orthogonally to the fins 51. The bellows 27 has a circular cross-section and the size of the longer side of the nozzle 37 is substantially equal to the inside diameter of the bellows 27. The nozzle 37 is positioned such that its rectangular cross-section extends above the mid portions of the parallel fins 51.

The operation of this embodiment is as follows. The cooling fluid 20 supplied to the housing 16 is distributed to the nozzles 37 through the inlet space 30 and is supplied to the independent heat sinks 35 provided on the associated integrated circuit chips 14. This nozzle 37 has a rectangular cross-section so that the cooling fluid jetted from the nozzle 37 forms a slit-like two-dimensional stream which is directed to lengthwise mid portions of the parallel tabular fins 51 inside the heat sink. The stream of the cooling fluid is then split at the lengthwise mid portions of the parallel tabular fins 51 into two portions which are directed towards both longitudinal ends of the fins 51 along the passages defined by adjacent parallel tabular fins 51, thereby to absorb heat generated by each integrated circuit chip 14. The cooling fluid flowing out the passages defined by the parallel tabular fins 51 is introduced into the outlet space 31 through the passage formed in the bellows 27 and is discharged through an outlet 22 formed in the outermost wall of the housing. In this embodiment, the cooling fluid is distributed evenly to all fins by virtue of the nozzle 37 having a rectangular cross-section which spans substantially all fins. In addition, the stream of the cooling fluid from the nozzle 37 is first directed to lengthwise mid portions of the parallel tabular fins 51 and is then split into two portions which are directed towards both lengthwise ends of the fins along the passages defined by these fins. Consequently, the length of the passages defined by the fins is half that of the fin length, so that the fluid pressure loss is reduced to about ¼ that encountered when the cooling fluid is made to flow from one to the other longitudinal ends of the fins, thus enabling supply of the cooling fluid at a greater flow rate thereby facilitating enhancement of the cooling effect. The number of the parallel tabular fins can be increased to enhance the cooling power without difficulty. In this embodiment, since the cooling fluid is sealed against the space 32 by the heat sink 35 and the bellows 27, the cooling fluid flowing through the heat sink does never contacts with the integrated circuit chip 14. This makes it possible to use a fluid having superior cooling power such as water. Furthermore, in this embodiment, the heat sink 35 and the housing 16 are connected through flexible bellows 27 having a circular cross-section which effectively absorbs any mounting error and thermal distortion, thus eliminating application of excess stress to the integrated circuit chip 14 and the solder bump 13. The length of the rectangular cross-section of the nozzle 37 is substantially equal to the inside diameter of the bellows 27 so that the nozzle 37 effectively prevents oscillation or vibration of the bellows 27, thereby preventing the heat sink 35 from deviating from the integrated circuit chip 14.

A further enhancement of the cooling effect is possible by jointing the heat sink 35 to the integrated circuit chip 14 so as to form an integral structure. In such a case, in order to reduce the thermal stress caused by the difference in thermal expansion coefficient between the integrated circuit chip 14 and the heat sink 35, it is preferred that the fins 51 and the base 61 are made of a material having a high thermal conductivity and a small thermal expansion coefficient, such as Si, SiC and AlN, using the base 61 as the bottom plate 8 of the heat sink 35.

The embodiment shown in FIGS. 25 and 26 may be modified by provision of a cover plate 39 of the type shown in FIG. 20 or by adoption of segmented fins as shown in FIG. 21 for the purpose of improving cooling efficiency.

In the embodiments shown in FIGS. 17 to 26, the nozzle 37 is formed as a duct having a rectangular cross-section. This, however, is only illustrative and these embodiments may employ an array of circular pipes serving as a nozzle.

As will be understood from the foregoing description, according to the present invention, it is possible to use, as a cooling medium, a fluid having a high cooling power such as water. In addition, the present invention makes it possible to use parallel tabular fins which have large heat dissipation effect. In addition, the cooling fluid can be uniformly distributed to all fins by means of the nozzle having a rectangular cross-section. Consequently, extremely superior heat dissipation performance can be attained by the present invention.

Although the illustrative embodiments of the present invention have been described in detail with reference to the accompanying drawings, it is to be understood that the present invention is not limited to those precise embodiments. A variety of modifications or changes may be effected therein by one skilled in the art without departing from the scope of spirit of the invention.

What is claimed is:

1. A semiconductor cooling device comprising:
   a printed board having an element-carrying surface carrying a plurality of integrated circuit elements or packages; a heat sink provided for each of said elements or packages and having an internal space through which a refrigerant is circulated; and a housing which seals the element-carrying surface of said printed board in a liquid-tight manner;
   said housing having a three-layered structure including a space for sealing said element-carrying surface in liquid-tight manner, a header portion for discharging said refrigerant and a header portion for supplying said refrigerant,
   each said heat sink being connected to the refrigerant discharging header portion in a liquid-tight manner through a flexible structure which extends perpendicularly to said printed board and which has an inside diameter substantially equal to the width of each of said elements or packages; and
   a plurality of nozzles operatively arranged in said housing and extending perpendicularly to said printed board through said flexible structure at positions corresponding to the positions where said elements or packages are carried, said nozzles having outlet openings in the respective heat sinks, so as to supply said refrigerant from the refrigerant supplying header to the respective heat sinks,
   each said heat sink having an inner bottom plate on which are formed a plurality of parallel tabular fins perpendicular to said element-carrying surface, the openings of said nozzles having a substantially rectangular cross-section positioned above mid-portions of the fins, the longer axis of which extends perpendicularly to the longitudinal axes of said parallel tabular fins and is substantially equal to an inside diameter of said flexible structure,
   such that said refrigerant is supplied from the mid-portion of the fins to outward portions of the fins.

2. A semiconductor cooling device according to claim 1, wherein said flexible structure comprises bellows.

3. A semiconductor cooling device according to claim 1, further comprising a cover plate which covers an upper side of said fins around each of said nozzles.

4. A semiconductor cooling device according to claim 1, wherein each said fins is divided into segments.

5. A semiconductor cooling device according to claim 1, wherein said nozzles associated with adjacent heat sinks are arranged orthogonally to each other.

6. An arrangement structure of a plurality of semiconductor cooling devices, wherein said plurality of semiconductor cooling devices comprises:
   a printed board having an element-carrying surface carrying a plurality of integrated circuit elements or packages; a heat sink provided for each of said elements or packages and having an internal space through which a refrigerant is circulated; and a housing which seals the element-carrying surface of said printed board in a liquid-tight manner;
   said housing having a three-layered structure including a space for sealing said element-carrying surface in liquid-tight manner, a header portion for discharging said refrigerant and a header portion for supplying said refrigerant,
   each said heat sink being connected to the refrigerant discharging header portion in a liquid-tight manner through a flexible structure which extends perpendicularly to said printed board and which has an inside diameter substantially equal to the width of each of said elements and packages; and
   a plurality of nozzles operatively arranged in said housing and extending perpendicularly to said printed board through said flexible structure at positions corresponding to the positions where said elements or packages are carried, said nozzles having outlet openings in the respective heat sinks, so as to supply said refrigerant from the refrigerant supplying header to the respective heat sinks, each said heat sink having an inner bottom plate on which are formed a plurality of parallel tabular fins perpendicular to said element-carrying surface, the openings of said nozzles having a substantially rectangular cross-section positioned above mid-portions of the fins, the longer axis of which extends perpendicularly to the longitudinal axes of said parallel tabular fins and is substantially equal to an inside diameter of said flexible structure, said outlet openings of said nozzles being located substantially above mid-portions of said parallel tabular fins such that said refrigerant is supplied from the mid-portion of the fins to outward portions of the fins, and wherein adjacent semiconductor cooling devices are so arranged that said nozzles associated with said adjacent semiconductor cooling devices are orthogonal to each other.

* * * * *